(12) United States Patent
Lee et al.

(10) Patent No.: US 10,642,323 B2
(45) Date of Patent: May 5, 2020

(54) MOBILE TERMINAL

(71) Applicant: LG ELECTRONICS INC., Seoul (KR)

(72) Inventors: Joseph Lee, Seoul (KR); Sanghoon Kim, Seoul (KR); Kyungui Park, Seoul (KR); Chansin Park, Seoul (KR); Jaewoong Lee, Seoul (KR); Sukwon Jang, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 96 days.

(21) Appl. No.: 15/946,871

(22) Filed: Apr. 6, 2018

(65) Prior Publication Data
US 2019/0121407 A1    Apr. 25, 2019

(30) Foreign Application Priority Data
Oct. 20, 2017   (KR) .......................... 10-2017-0136819

(51) Int. Cl.
| F25B 29/00 | (2006.01) |
| G06F 1/20 | (2006.01) |
| G06F 1/18 | (2006.01) |
| H01L 23/473 | (2006.01) |
| H01L 23/44 | (2006.01) |

(52) U.S. Cl.
CPC .............. G06F 1/203 (2013.01); G06F 1/183 (2013.01); H01L 23/44 (2013.01); H01L 23/473 (2013.01); *G06F 2200/201* (2013.01)

(58) Field of Classification Search
CPC .... G06F 1/203; G06F 1/183; G06F 2200/201; H04M 1/0277; H05K 3/28; H01L 23/373; H01L 23/473
USPC ....................................................... 165/253
See application file for complete search history.

(56) References Cited

U.S. PATENT DOCUMENTS

| 9,224,672 B1* | 12/2015 | Pykari ................... H01L 23/373 |
| 2010/0118503 A1* | 5/2010 | Kellermann ............. H05K 3/28 |
| | | 361/772 |
| 2017/0054836 A1* | 2/2017 | Chung ................ H04M 1/0277 |

* cited by examiner

*Primary Examiner* — Davis D Hwu
(74) *Attorney, Agent, or Firm* — Birch, Stewart, Kolasch & Birch, LLP

(57) ABSTRACT

A mobile terminal includes: a terminal body; a circuit board installed in the terminal body; an electronic device mounted to at least one surface of the circuit board; a shield can installed on the circuit board so as to cover the electronic device, and configured to shield electromagnetic waves generated from the electronic device; and a cooling fluid filled in an inner space defined by the circuit board and the shield can, and configured to cool the electronic device.

14 Claims, 8 Drawing Sheets

MOBILE TERMINAL

CROSS-REFERENCE TO RELATED APPLICATION

Pursuant to 35 U.S.C. § 119(a), this application claims the benefit of an earlier filing date of and the right of priority to Korean Application No. 10-2017-0136819, filed on Oct. 20, 2017, the contents of which are incorporated by reference herein in its entirety.

BACKGROUND OF THE INVENTION

1. Field of the Invention

This specification relates to a mobile terminal capable of cooling electronic devices positioned in a shield can.

2. Background of the Invention

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs. Various attempts have been made to implement complicated functions in such a multimedia device by means of hardware or software.

Recently, as the mobile terminal has a simple design and a small thickness, there is a difficulty in effectively cooling heat generated from a circuit board or an electronic device installed in the mobile terminal when the mobile terminal is operated. If such heat generated when the mobile terminal is operated is not rapidly cooled, the electronic device may have a degraded performance and a user's discomfort may be caused.

To solve such problems, a heat emitting material is positioned between the electronic device and a shield can, thereby cooling the electronic device by directly contacting the electronic device. Alternatively, a cooling fan is additionally installed to cool heat generated from the circuit board or the electronic device. However, it may be less efficient to cool the circuit board or the electronic device by such a heat emitting material. Further, it is difficult to obtain a space for installation of such an additional cooling fan, due to a small size of the mobile terminal. This may cause the mobile terminal to have a complicated structure.

Thus, required is a mobile terminal capable of having a simple structure by considering a characteristic of the mobile terminal of which orientation (a position or a direction) is changed as it is carried by a user, by making an electronic device or a circuit board installed in the mobile terminal directly contact a fluid, and capable of obtaining a cooling performance higher than that by natural convection.

SUMMARY OF THE INVENTION

Therefore, an aspect of the detailed description is to provide a configuration of a mobile terminal capable of effectively cooling heat generated from an electronic device, by making a cooling fluid accommodated in a shield can contact the electronic device.

Another aspect of the detailed description is to provide a configuration of a mobile terminal capable of obtaining a sufficient cooling performance by smoothly circulating a cooling fluid accommodated in a shield can, by a characteristic of the mobile terminal of which orientation is changed according to a user's usage.

To achieve these and other advantages and in accordance with the purpose of this specification, as embodied and broadly described herein, there is provided a mobile terminal, comprising: a terminal body; a circuit board installed in the terminal body; an electronic device mounted to at least one surface of the circuit board; a shield can installed on the circuit board so as to cover the electronic device, and configured to shield electromagnetic waves generated from the electronic device; and a cooling fluid filled in an inner space defined by the circuit board and the shield can, and configured to cool the electronic device.

In an embodiment of the present invention, the shield can may include a base portion installed on the circuit board, and configured to accommodate the electronic device therein. A fluid introduction hole may be penetratingly-formed at one side of the base portion such that the cooling fluid may be filled in the inner space. A shielding member fitted into the fluid introduction hole and configured to prevent leakage of the cooling fluid filled in the inner space may be installed at the base portion.

In an embodiment of the present invention, the cooling fluid may be formed as at least two materials having different densities are mixed with each other.

In an embodiment of the present invention, the shield cans may be installed to cover the electronic devices installed on an upper surface and a lower surface of the circuit board. And the cooling fluid may be accommodated in the inner space defined by the circuit board and the shield can.

The mobile terminal having such a structure may have the following advantages.

Firstly, since the electronic device disposed in the shield can directly contacts the cooling fluid, heat generated from the electronic device is absorbed through the cooling fluid. This may allow the electronic device to be cooled effectively.

Further, the cooling fluid is formed by mixing at least two materials having different densities with each other, and the cooling fluid is circulated more smoothly by an orientation change. This may allow a cooling performance to be obtained continuously and easily.

Further, the cooling fluid accommodated in the shield can flows by vibrating the haptic module, or by outputting a screen outputted to the display unit after converting to a horizontal or vertical direction. This may allow the electronic device to be cooled continuously and easily.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1A:
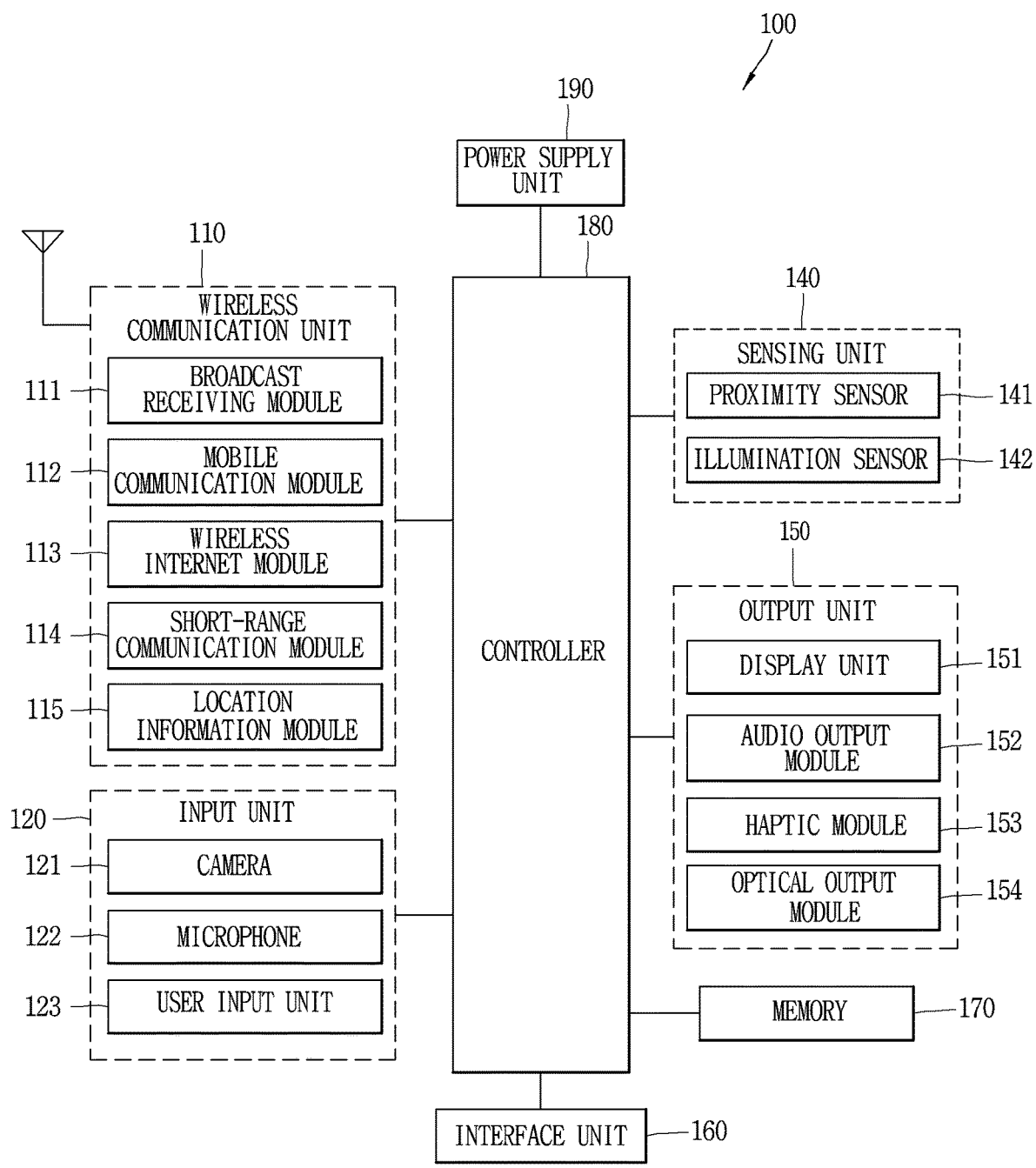
FIG. 1A is a block diagram of a mobile terminal according to the present invention.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the other element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, and the like.

FIG. 1A is a block diagram of a mobile terminal in accordance with the present disclosure.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

The mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 typically includes one or more modules which permit communications such as wireless communications between the mobile terminal 100 and a wireless communication system, communications between the mobile terminal 100 and another mobile terminal, communications between the mobile terminal 100 and an external server. Further, the wireless communication unit 110 typically includes one or more modules which connect the mobile terminal 100 to one or more networks.

To facilitate such communications, the wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142.

If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154.

The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

The controller 180 typically functions to control overall operation of the mobile terminal 100, in addition to the operations associated with the application programs. The controller 180 may provide or process information or functions appropriate for a user by processing signals, data, information and the like, which are input or output by the various components depicted in FIG. 1A, or activating application programs stored in the memory 170. As one example, the controller 180 controls some or all of the components illustrated in FIGS. 1A-1C according to the execution of an application program that have been stored in the memory 170.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some of the above components may operate in a cooperating manner, so as to implement an operation or a control method for a glass type terminal according to various embodiments to be explained later. The operation or the control method for the glass type terminal may be implemented on the glass type terminal by driving at least one application program stored in the memory 170.

Referring still to FIG. 1A, various components depicted in this figure will now be described in more detail. Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like). Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution-Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal.

As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input. Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like).

In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images.

A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Figure 1B:
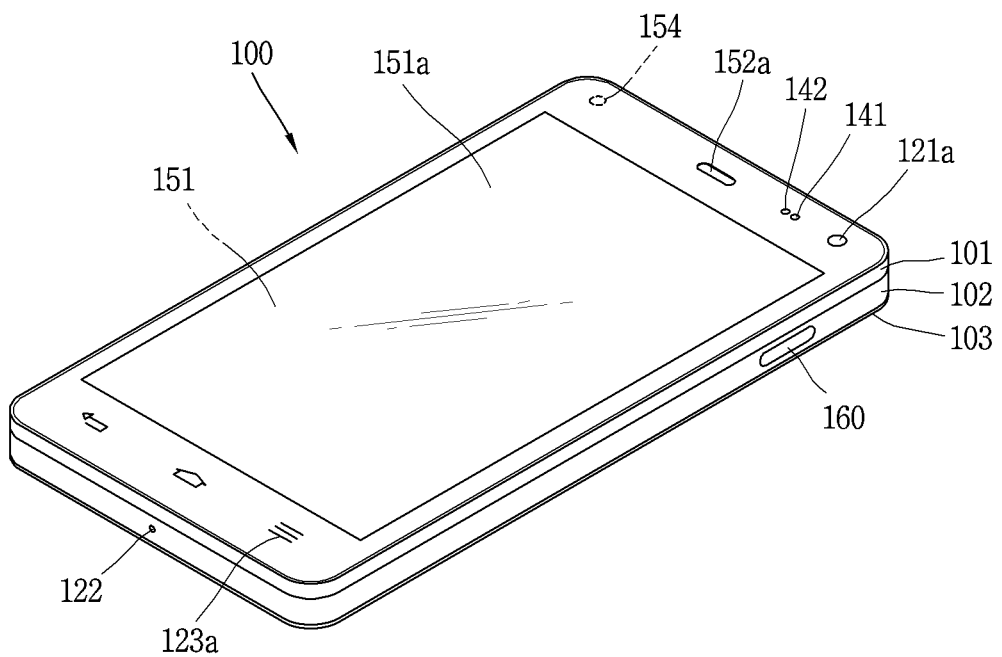
FIG. 1B is a perspective view showing a front surface of the mobile terminal.
Figure 1C:
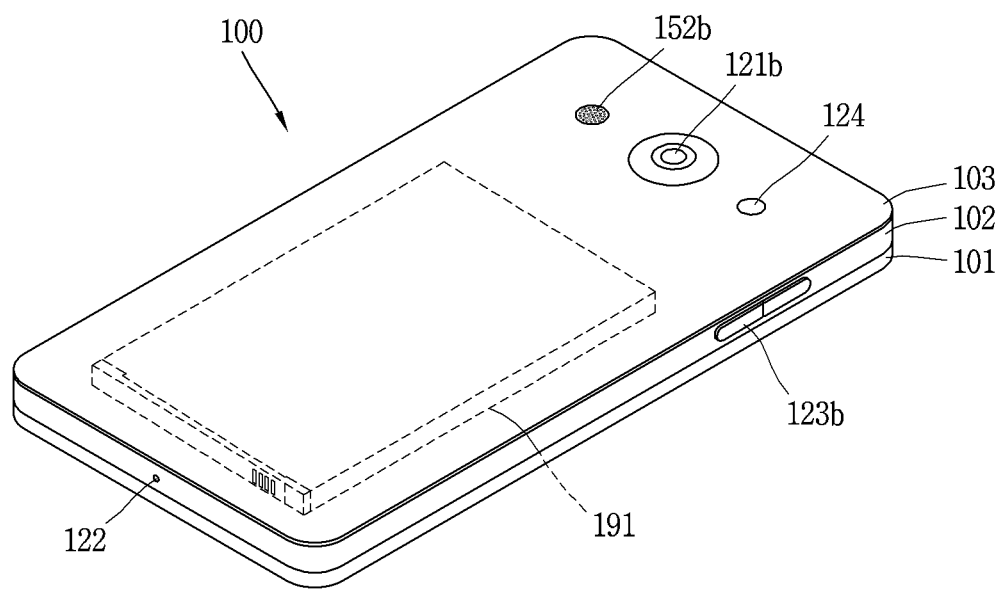
FIG. 1C is a perspective view showing a rear surface of the mobile terminal.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal (for example, bar-type, watch-type, glasses-type, and the like). However, such teachings with regard to a particular type of mobile terminal will generally apply to other types of mobile terminals as well.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121*b* or an audio output module 152*b*.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151*a* and the front case 101, between the front case 101 and the rear case 102, or between the rear case 102 and the rear cover 103, to hermetically seal an inner space when those cases are coupled.

Figure 10:
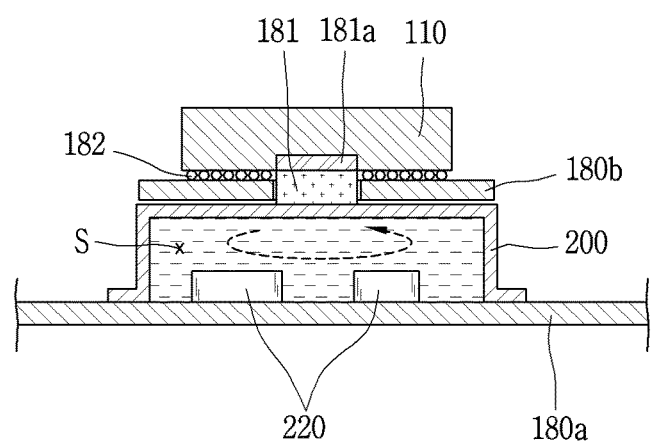
FIG. 10 is a view of a mobile terminal according to another embodiment of the present invention.

FIGS. 1B and 10 depict certain components as arranged on the mobile terminal. However, it is to be understood that alternative arrangements are possible and within the teachings of the instant disclosure. Some components may be omitted or rearranged. For example, the first manipulation unit 123*a* may be located on another surface of the terminal body, and the second audio output module 152*b* may be located on the side surface of the terminal body.

The display unit 151 outputs information processed in the mobile terminal 100. The display unit 151 may be implemented using one or more suitable display devices. Examples of such suitable display devices include a liquid crystal display (LCD), a thin film transistor-liquid crystal display (TFT-LCD), an organic light emitting diode (OLED), a flexible display, a 3-dimensional (3D) display, an e-ink display, and combinations thereof.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151*a* and a display on a rear surface of the window 151*a*, or a metal wire which is patterned directly on the rear surface of the window 151*a*. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123*a*.

The first audio output module 152*a* may be implemented in the form of a speaker to output voice audio, alarm sounds, multimedia audio reproduction, and the like.

The window 151*a* of the display unit 151 will typically include an aperture to permit audio generated by the first audio output module 152*a* to pass. One alternative is to allow audio to be released along an assembly gap between the structural bodies (for example, a gap between the window 151*a* and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121*a* can process image frames such as still or moving images obtained by the image sensor in a capture mode or a video call mode. The processed image frames can then be displayed on the display unit 151 or stored in the memory 170.

The first and second manipulation units 123*a* and 123*b* are examples of the user input unit 123, which may be manipulated by a user to provide input to the mobile terminal 100. The first and second manipulation units 123*a* and 123*b* may also be commonly referred to as a manipulating portion, and may employ any tactile method that allows the user to perform manipulation such as touch, push, scroll, or the like. The first and second manipulation units 123*a* and 123*b* may also employ any non-tactile method that allows the user to perform manipulation such as proximity touch, hovering, or the like.

FIG. 1B illustrates the first manipulation unit 123*a* as a touch key, but possible alternatives include a mechanical key, a push key, a touch key, and combinations thereof.

Input received at the first and second manipulation units 123*a* and 123*b* may be used in various ways. For example, the first manipulation unit 123*a* may be used by the user to provide an input to a menu, home key, cancel, search, or the like, and the second manipulation unit 123*b* may be used by the user to provide an input to control a volume level being output from the first or second audio output modules 152*a* or 152*b*, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. Alternatively, the rear input unit can be positioned at most any location of the rear side of the terminal body.

Embodiments that include the rear input unit may implement some or all of the functionality of the first manipulation unit 123a in the rear input unit. As such, in situations where the first manipulation unit 123a is omitted from the front side, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a. If desired, second camera 121a may alternatively be located at other locations, or made to be moveable, in order to have a different image capturing direction from that which is shown.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 10, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body. The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

In the following descriptions, a mobile terminal will be explained as an example of the aforementioned electronic device 100.

Figure 2:
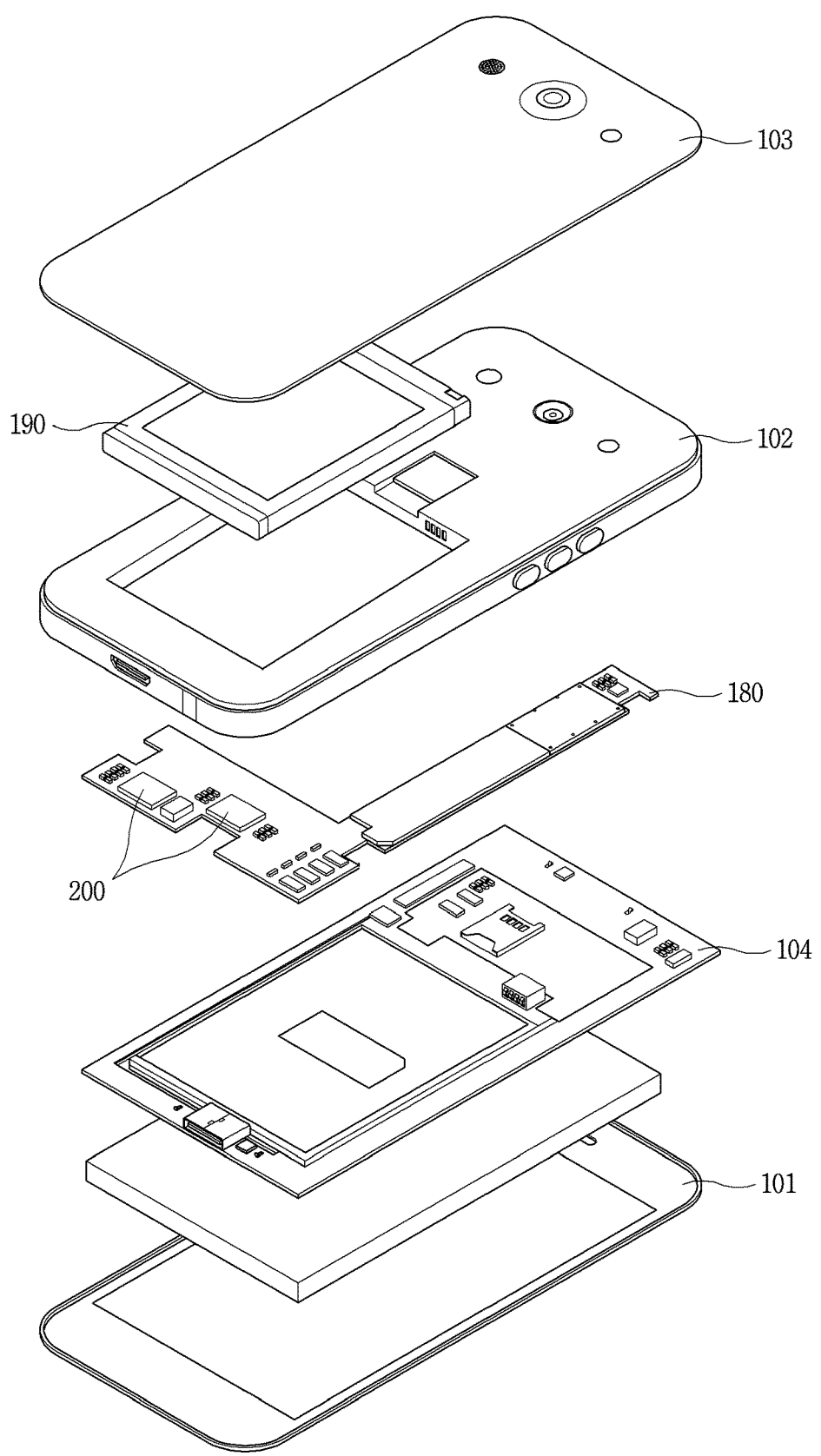
FIG. 2 is a disassembled perspective view of the mobile terminal according to the present invention.

FIG. 2 is a disassembled perspective view of the mobile terminal 100 according to the present invention.

The mobile terminal 100 has an inner space formed by the front case 101 and the rear case 102, and the rear cover 103 is coupled to the rear case 102. An accommodation space for mounting the battery 191 may be formed on one surface of the rear case 102. The rear cover 103 may be mounted to the rear case 102 so as to cover the battery 191.

An inner frame 104 for supporting a plurality of electronic devices 220 (refer to FIG. 3) is disposed in the rear case 102. The display unit 151 is coupled to one surface of the inner frame 104, and a circuit board 180 is installed on another surface of the inner frame 104. The plurality of electronic devices 220 including a driving chip (not shown) are disposed on the circuit board 180.

As shown in FIG. 2, the circuit board 180 may be formed not to overlap the battery 190. Shield cans 200 are installed on the electronic devices 220 to cover the electronic devices 220.

The plurality of shield cans 200 may be formed to cover the electronic devices individually. The shield cans 200 may be formed of a metallic material, and are fixed to the circuit board 180. The shield cans 200 serve to emit electromagnetic waves generated as the electronic devices 220 operate to a ground region of the circuit board 180, thereby preventing the electromagnetic waves from radiating to an external space of the shield cans.

Figure 3A:
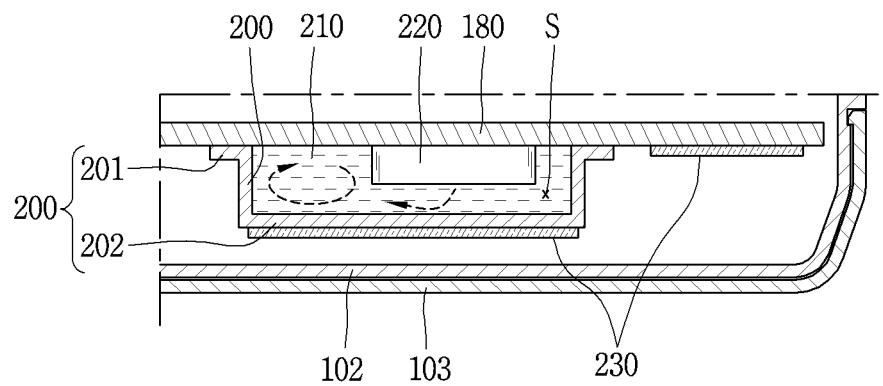
FIG. 3A is a sectional view showing an inner structure of the mobile terminal of FIG. 2.
Figure 3B:
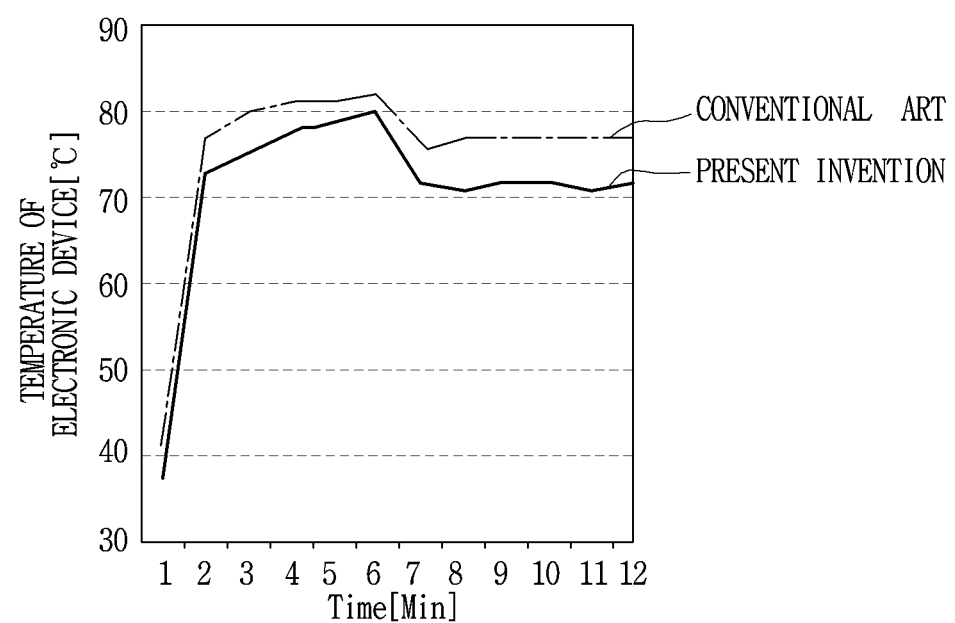
FIG. 3B is a graph showing a cooling effect of an electronic device by a cooling fluid.

FIG. 3A is a sectional view showing an inner structure of the mobile terminal 100 of FIG. 2, and FIG. 3B is a graph showing a cooling effect of the electronic devices 220 by a cooling fluid 210.

The circuit board 180 may be disposed at a space formed by the front case 101 and the rear case 102, and the plurality of electronic devices 220 may be installed at the circuit board 180.

The electronic devices 220 installed at the circuit board 180 may be an application processor (AP) for processing data, or may be a power amplifier module (PAM) for supplying a power after a conversion. Once the mobile terminal 100 is operated, a large amount of heat may be generated while data and a power are processed. This may cause the electronic devices 220 to have an increased temperature.

If the AP and the PAM have their temperature increased to more than a predetermined value by heat generated from the electronic devices 200, they may have their performance degraded. In a severe case, the electronic devices 220 may be damaged by a thermal runaway, and a dead phenomenon that the mobile terminal 100 is not normally operated may occur. Further, heat generated from the respective electronic devices 220 is transferred to the circuit board 180, resulting in providing a discomfort due to a high temperature to a user.

In the mobile terminal 100 according to the present invention, the electronic devices 220 are mounted to at least one surface of the circuit board 180. And the shield cans 200 are installed at the circuit board 180 so as to cover the electronic devices 220, thereby shielding electromagnetic waves generated from the electronic devices 220. Since the cooling fluid 210 is filled in an inner space (S) defined by the shield can 200 and the circuit board 180, the cooling fluid 210 and the electronic device 220 contact each other. This may allow a heat exchange to be performed more effectively, thereby cooling the electronic devices 200. Such a cooling is more effective than a cooling by natural convection.

As shown in FIG. 3B, in the mobile terminal 100 according to the present invention, as the electronic devices 220 contact the cooling fluid 210, a drastic temperature increase of the electronic devices 220 is more restricted than in the conventional mobile terminal. Further, in the present invention, a highest increase temperature may be lower than that in the conventional art, and an increased temperature of the electronic devices 220 may be rapidly lowered.

The shield cans 200 include a coupling portion 201 inserted into a coupling hole (not shown) formed at the circuit board 180 and fixed thereto, and a base portion 202 formed to enclose the electronic devices 220 and formed to have a constant gap from the electronic devices 220. The inner space (S) formed by the coupling portion 201 and the base portion 202 may be formed to be hermetically sealed. The coupling portion 201 and the base portion 202 may be formed of a material which can prevent leakage of the cooling fluid 210.

A tape formed of a waterproofing material or silicone may be applied to a coupling part between the coupling portion 201 and the circuit board 180, in order to restrict leakage of the cooling fluid to a gap therebetween, thereby preventing leakage of the cooling fluid through the gap therebetween.

Further, a waterproofing coating layer (not shown) may be applied to the surface of the circuit board 180 at a small thickness, thereby restricting the cooling fluid 210 accommodated in the shield cans 200 from being absorbed to the circuit board 180.

The cooling fluid 210 accommodated in the inner space (S) defined by the shield cans 200 and the circuit board 180 may absorb heat generated while the electronic devices 220 are operated, by contacting the electronic devices 220. And the cooling fluid 210 which has absorbed heat by contacting the electronic devices 220 may be circulated according to a characteristic of the mobile terminal 100 having its orientation changed.

The cooling fluid 210 may be formed of a material composed of water, air, a refrigerant of FC-72 or FC-84 (i.e., a type of inert fluoride compounds), and oil. Alternatively, the cooling fluid 210 may be formed as at least two materials having different densities are mixed with each other. In this case, the cooling fluid 210 should be formed of materials having different densities, and should be circulated by a difference of the densities. Alternatively, the cooling fluid 210 is preferably formed of a polar material and a non-polar material such that the materials do not form a compound by being mixed with each other.

For instance, the cooling fluid 210 may be formed as 90% of water and 10% of air are mixed with each other. Alternatively, the cooling fluid 210 may be formed as water and a material having an oil component are mixed with each other. In this case, a mixture ratio of the different materials may be arbitrarily selected.

If the cooling fluid 210 is formed by selecting two or more materials having different densities, the cooling fluid 210 may be circulated more smoothly by a density difference together with an orientation change of the mobile terminal 100 according to a user's movement or motion. As a result, the cooling fluid 210 may effectively absorb heat generated from the electronic devices 220.

Figure 4A:
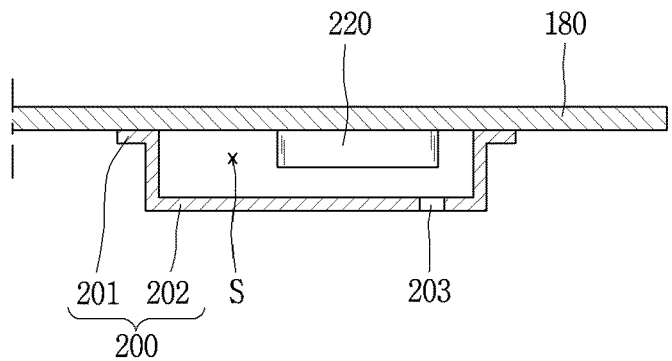
FIG. 4A is a sectional view showing that a shield can 200 is installed on a circuit board.
Figure 4B:
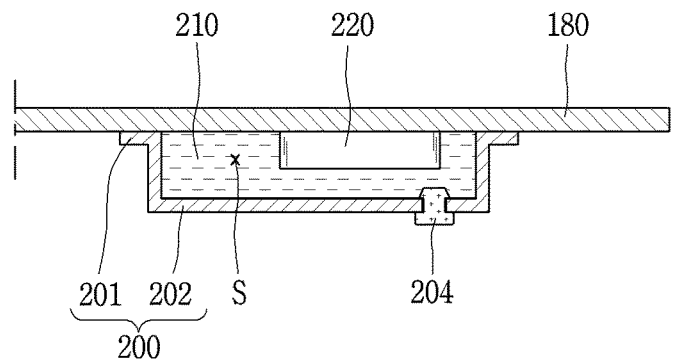
FIG. 4B is a sectional view showing that a cooling fluid is filled in an inner space defined by the shield can and the circuit board.

FIG. 4A is a view showing that the shield can 200 is installed on the circuit board 180, and FIG. 4B is a view showing that the cooling fluid 210 is filled in an inner space defined by the shield can 200 and the circuit board 180.

In order to fill the cooling fluid 210 in a space formed between the shield can 200 and the circuit board 180, the shield can 200 should be firstly installed on one surface of the circuit board 180. Once the shield can 200 is fixed to the circuit board 180 through the coupling portion 201, the base portion 202 may be formed to cover the electronic device 220 with a predetermined gap from the electronic device 220.

As shown in FIG. 4A, a fluid introduction hole 203 is penetratingly-formed at one side of the base portion 202 of the shield can 200, and the cooling fluid 210 can be injected to the inner space (S) through the fluid introduction hole 203. A size and a shape of the fluid introduction hole 203 may be implemented in various manners. However, it is preferable for the fluid introduction hole 203 to have a relatively small sectional surface, for restriction of leakage of the cooling fluid 210.

Once the cooling fluid 210 is injected to the inner space (S) through the fluid introduction hole 203, the inner space (S) having the cooling fluid 210 accommodated therein may be hermetically sealed by a shielding member 204, as shown in FIG. 4B.

Since the shielding member 204 is formed to have a cap shape and is fitted into the fluid introduction hole 203, a refrigerant accommodated in the inner space (S) may be prevented from leaking.

The shielding member 204 may be formed of a silicon material, and one end of the shielding member 204 may be tapered to be inserted into the fluid introduction hole 203. A head portion larger than the fluid introduction hole 203 is formed at another end of the shielding member 204, thereby preventing the shielding member 204 from being introduced into the inner space through the fluid introduction hole 203.

Figure 5:
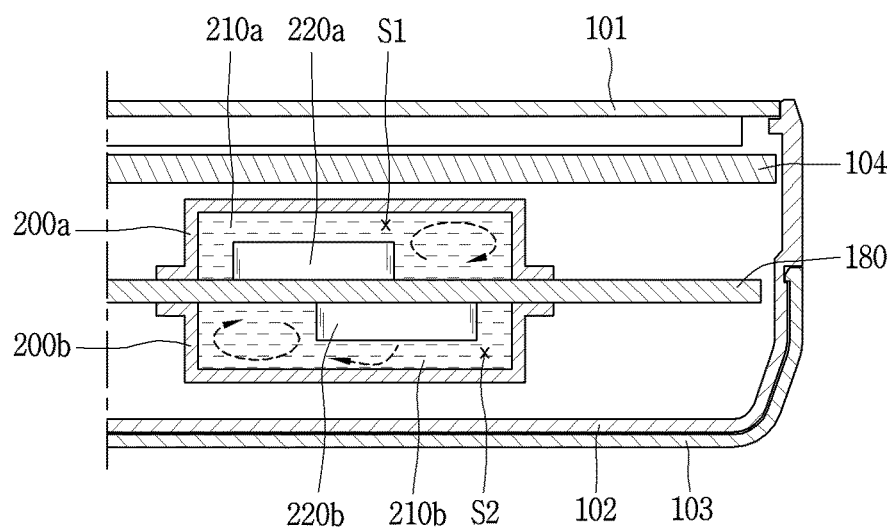
FIG. 5 is a sectional view showing an inner configuration of the mobile terminal according to another embodiment of the present invention.

FIG. 5 is a view showing an inner configuration of the mobile terminal 100 according to another embodiment of the present invention.

The electronic devices 220 may be installed on an upper surface and a lower surface of the circuit board 180, and shield cans 200a, 200b may be installed so as to cover the electronic devices 220. The cooling fluid 210 may be filled in the inner space (S) defined by the shield cans 200a, 200b and the circuit board 180.

As shown in FIG. 5, a first electronic device 220a is installed on the upper surface of the circuit board 180, and the first shield can 200a is installed to cover the first electronic device 220a. A second electronic device 220b is installed on the lower surface of the circuit board 180, and the second shield can 200b is installed to cover the second electronic device 220b. A first cooling fluid 210a may be filled in a first space (S1) defined by the first shield can 200a and an upper surface of the circuit board 180, and a second cooling fluid 210b may be filled in a second space (S2) defined by the second shield can 200b and a lower surface of the circuit board 180. The upper surface of the circuit board 180 may mean one surface which faces the front case 101, and the lower surface of the circuit board 180 may mean one surface which faces the rear case 102.

The first cooling fluid 210a filled in the first space (S1) may absorb heat generated from the first electronic device 220a, by contacting the surface of the first electronic device 220a. And the second cooling fluid 210b filled in the second space (S2) may absorb heat generated from the second electronic device 220b, by contacting the surface of the second electronic device 220b.

Here, the first cooling fluid 210a and the second cooling fluid 210b may be formed of a material composed of water, air, FC-72 and an oil component. And the first cooling fluid 210a and the second cooling fluid 210b may be formed by mixing two or more materials having different densities with each other, for circulation due to a density difference.

The first cooling fluid 210a and the second cooling fluid 210b may be formed of different materials.

That is, in the mobile terminal 100 according to this embodiment of the present invention, as the electronic devices 220a, 220b and the cooling fluids 210a, 210b installed on the upper and lower surfaces of the circuit board 180, respectively contact each other, a heat exchange may be performed. Further, as heat generated from the electronic devices 220a, 220b is effectively absorbed, a temperature increase of each of the electronic devices 220 may be prevented.

Figure 6:
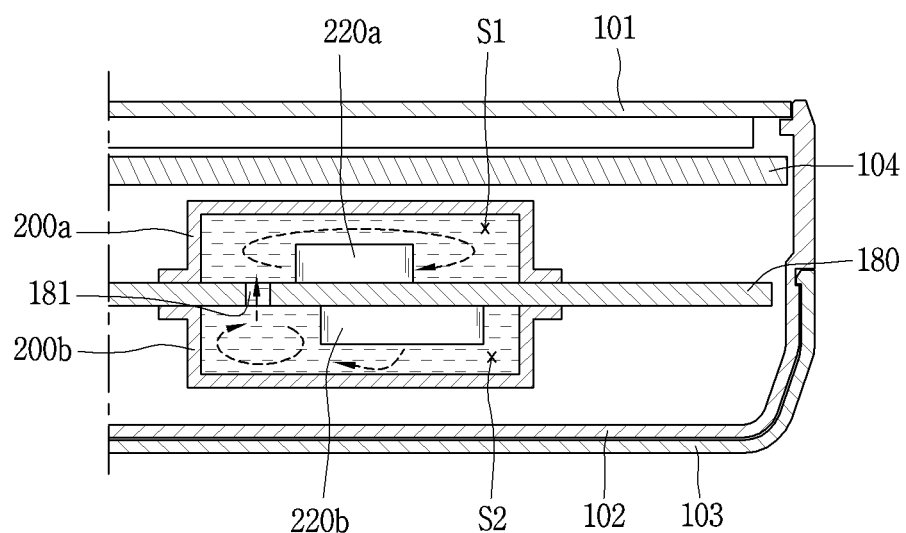
FIG. 6 is a sectional view showing an inner configuration of the mobile terminal where cooling fluids accommodated in shield cans are moveable therebetween.

As shown in FIG. 6, the mobile terminal 100 according to another embodiment of the present invention has a structure that a through hole 181 is penetratingly-formed at the circuit board 180 such that the cooling fluids 210 accommodated in the shield cans 200 installed on both surfaces of the circuit board 180 can flow therebetween. The cooling fluids 210 may be filled in the shield cans 200a, 200b installed on the upper and lower surfaces of the circuit board 180, and the cooling fluids 210 filled in the shield cans 200a, 200b may move via the through hole 181. This may allow the cooling fluid 210 to move more smoothly according to an orientation change of the mobile terminal 100.

The through hole 181 may be formed at one side of the circuit board 180 where the first and second shield cans 200a, 200b are overlapped with each other, and may be formed in plurality.

Figure 7:
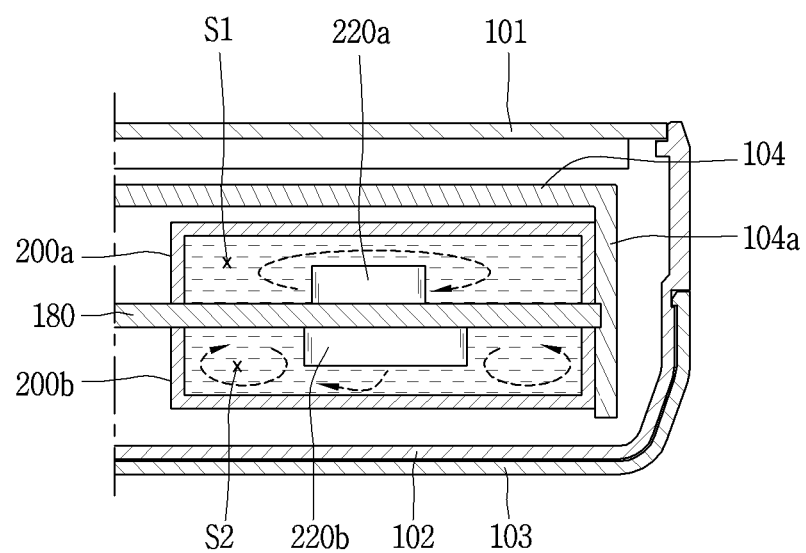
FIG. 7 is a sectional view showing an inner configuration of the mobile terminal where a heat exchange is performed as each shield can and an inner frame contact each other.

FIG. 7 is a view showing the mobile terminal 100 according to another embodiment of the present invention.

The first shield can 200a installed on the upper surface of the circuit board 180, and the second shield can 200b installed on the lower surface of the circuit board 180 may be configured such that one sides thereof may contact the inner frame 104.

As aforementioned with reference to FIGS. 5 and 6, the cooling fluids 210a, 210b are filled in the inner spaces S1, S2 formed by the shield cans 200a, 200b, respectively, thereby absorbing heat generated from the electronic devices 220a, 220b installed in the shield cans 200a, 200b. In this case, one side of the inner frame 104 installed in the mobile terminal 100 may be extended towards the circuit board 180, thereby contacting one side of each of the shield cans 200a, 200b. And a heat exchange may be performed between the inner frame 104 and the respective shield cans 200a, 200b. If the heat exchange is performed between the inner frame 104 and the shield cans 200, an increased temperature of the electronic devices due to an operation of the mobile terminal 100 may be lowered more effectively.

Figure 8:
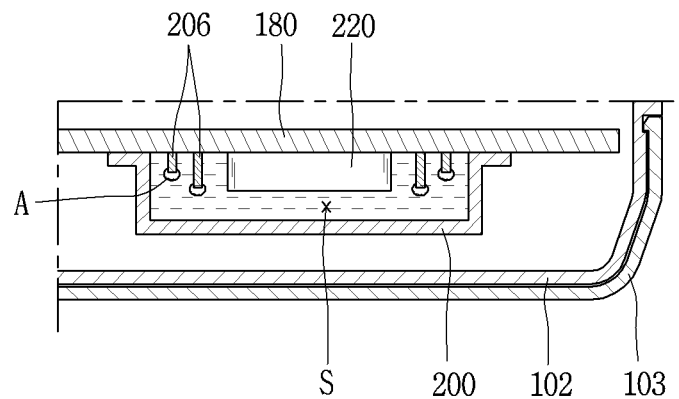
FIG. 8 is a sectional view of the mobile terminal, which shows that the cooling fluid accommodated in the shield can includes air.

FIG. 8 is a sectional view of the mobile terminal, which shows that the cooling fluid 210 accommodated in the shield can 200 includes air.

The electronic device 220 installed on one surface of the circuit board 180 is positioned at the hermetic inner space (S) formed by the shield can 200, and the cooling fluid 210 may absorb heat generated from the electronic device 220 as the electronic device 220 contacts the cooling fluid 210 filled in the inner space (S). If the cooling fluid 210 includes air, when the mobile terminal 100 is disposed at a specific position, the air may contact the electronic device 220 to lower an efficient cooling of the electronic device 220.

Thus, the mobile terminal 100 according to this embodiment includes a protrusion member 206 extended from one side of the circuit board 180 positioned at the inner space (S) formed by the shield can 200, by a height of the electronic device 220.

The protrusion member 206 may have any shape, and may have various heights. However, it is preferable that the height of the protrusion member 206 is greater than a width of the electronic device 220. The protrusion member 206 can be configured as a capacitor (not shown) which constitutes the electronic device.

If the mobile terminal 100 is disposed at a specific position near the electronic device 220, the protrusion member 206 may contact air (A) shown in FIG. 8 to restrict the electronic device 220 from being exposed to the air (A).

That is, if the cooling fluid 210 includes air, the protrusion member 206 protruded from the circuit board 180 may contact the air to prevent the air from contacting the electronic device 220.

Figure 9A:
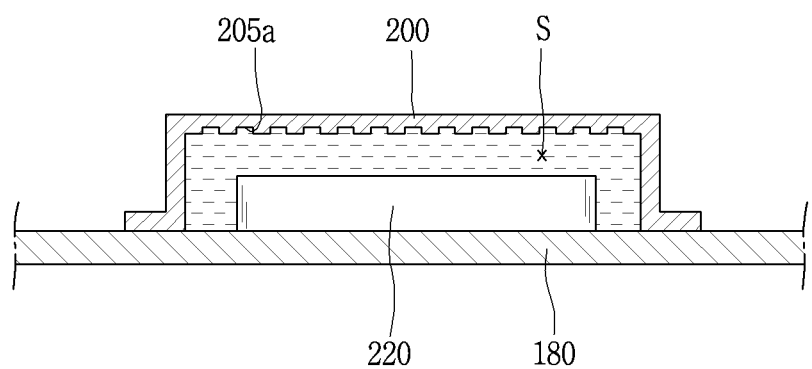
FIG. 9A is a view showing that concavo-convexed portions are formed on an inner side surface of the shield can.
Figure 9B:
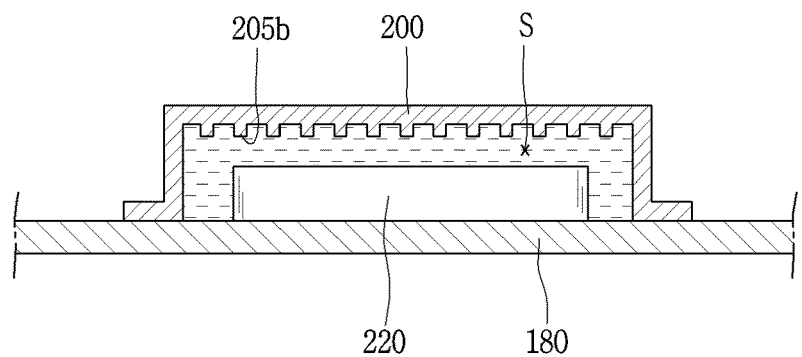
FIG. 9B is a view showing that protruding portions are formed on the inner side surface of the shield can.
Figure 9C:
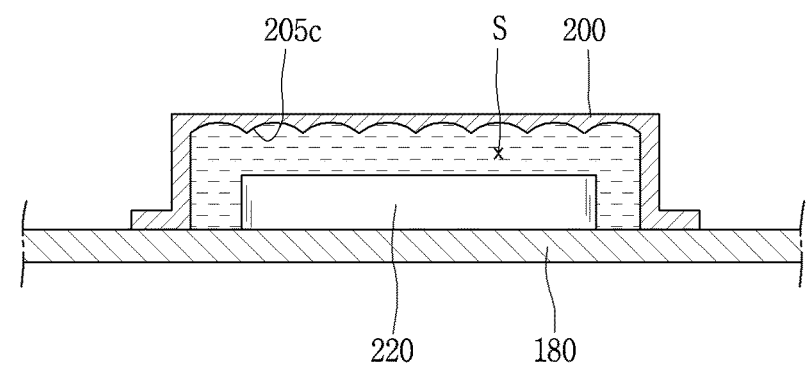
FIG. 9C is a view showing that dimples are formed on the inner side surface of the shield can.

FIGS. 9A-9C are views showing various shapes of an inner side surface of the shield can 200.

If the cooling fluid 210 accommodated in the inner space (S) defined by the circuit board 180 and the shield can 200 absorbs heat generated from the electronic device 220, the cooling fluid 210 has its temperature increased gradually. If the temperature of the cooling fluid 210 is increased, a heat exchange performance between the cooling fluid 210 and the electronic device 220 is reduced. The mobile terminal according to this embodiment is configured to maintain a cooling performance by the cooling fluid 210 through various shape changes of the shield can 200.

As shown in FIG. 9A, concavo-convexed portions 205a are formed on an inner side surface of the base portion 202, thereby increasing a contact area between the shield can 200 and the cooling fluid 210. This may reduce heat of the cooling fluid 210 more effectively. Further, as shown in FIG. 9B, a plurality of protruding portions 205b are formed on the inner side surface of the base portion 202 at predetermined intervals, thereby increasing a contact area between the shield can 200 and the cooling fluid 210. Further, a plurality of grooves implemented as dimples 205c may be formed on the inner side surface of the base portion 202 at predetermined intervals, thereby increasing a contact area between the cooling fluid 210 filled in the shield can 200 and the shield can 200.

FIG. 10 is a view of another embodiment of the mobile terminal 100 according to the present invention.

The mobile terminal 100 according to this embodiment includes a first circuit board 180a installed in a body (not shown), electronic devices 220 installed on one surface of the first circuit board 180a, and a shield can 200 installed on the first circuit board 180a so as to enclose the electronic devices 220. A second circuit board 180b is disposed at a position spaced apart from the shield can 200 by a predetermined distance, and a communication module 110 is mounted on the second circuit board 180b.

The communication module 110 may be directly disposed on the second circuit board 180b, or may be spaced apart from the second circuit board 180b by a predetermined distance. However, the communication module 110 should be connected to the second circuit board 180b through a contact terminal 182.

A cooling fluid 210 is filled in a space (S) defined by the shield can 200 and the first circuit board 180a. The cooling fluid 210 is formed as at least two materials having different densities are mixed with each other. In this case, the cooling fluid 210 may sufficiently absorb heat generated from the electronic devices 220, because it is smoothly circulated due to a characteristic of the mobile terminal of which orientation is changed.

As shown in FIG. 10, a lower surface of the second circuit board 180b positioned near the shield can 200 where the cooling fluid 210 is filled, is disposed near an upper surface of the shield can 200 having a relatively low temperature, thereby being indirectly cooled. Further, since the shield can 200 and the communication module 110 are disposed in a state that a heat absorbing material 181 is interposed therebetween, a heat exchange can be performed between the shield can 200 having a relatively low temperature and the communication module 110 having a relatively high temperature. Further, a heat generating portion 181a disposed below the communication module 110 can perform a heat exchange with the upper surface of the shield can 200 having its temperature lowered by the cooling fluid 210.

That is, the mobile terminal 100 according to this embodiment may cool the electronic devices 220 by the cooling fluid 210 accommodated in the shield can 200, and may cool even components disposed near the shield can 200 through a heat exchange, even under a structure that the first circuit board 180a, the second circuit board 180b and the communication module 110 are laminated on each other up and down.

Hereinafter, a configuration of the mobile terminal capable of smoothly circulating the cooling fluid 210 accommodated in the shield can 200 will be explained in brief.

As aforementioned with reference to FIGS. 3 to 10, the plurality of electronic devices 220 including a driving chip (not shown) are installed on the circuit board 180 installed in the mobile terminal 100, and the shield can 200 installed to cover the electronic devices 220 is configured to shield electromagnetic waves generated from the electronic devices 220.

As the cooling fluid 210 is accommodated in the space (S) formed by the shield can 200 and the circuit board 180, the cooling fluid 210 and the electronic devices 220 contact each other. As a result, heat generated from the electronic devices 220 is cooled, which has been aforementioned.

However, the mobile terminal 100 may further have a configuration to generate vibrations of the mobile terminal 100 or to induce a user to an orientation change of the mobile terminal 100, such that the cooling fluid 210 accommodated in the shield can 200 may be smoothly circulated.

The circuit board 180 of the mobile terminal 100 may include a temperature sensor for sensing a temperature, the haptic module 153 for generating vibrations, and a controller (not shown) for comparing the temperature sensed by the temperature sensor with a preset temperature and driving the haptic module 153 when the sensed temperature is more than the preset temperature.

The controller (not shown) may control a predetermined vibration pattern set by the haptic module 153 to be generated when the sensed temperature is more than the preset temperature. Here, the generated vibration pattern may be different from a vibration pattern generated when a general call or message is received. And the generated vibration pattern may have a larger strength than that generated when a call or a message is received.

If the circuit board 180 has a temperature more than a predetermined value, the cooling fluid 210 accommodated in the shield can 200 can be circulated more smoothly through vibrations generated from the haptic module 153.

If the sensed temperature is more than the preset temperature, the controller (not shown) may convert a direction of video information on the display unit which outputs the video information by being connected to the circuit board 180, such that a user may change an orientation of the mobile terminal 100. In this case, a circulation of the cooling fluid 210 accommodated in the shield can 200 may be induced.

For instance, the controller (not shown) may convert a direction of a screen outputted to the display unit 151, to a horizontal direction from a vertical direction. And if the screen direction outputted to the display unit 151 does not match the shape of the display unit 151, a user may turn the mobile terminal 100 to a horizontal direction or a vertical direction. In this case, a movement to circulate the cooling fluid 210 may be formed.

Further, if the sensed temperature is more than the preset temperature, the controller (not shown) can output, to the display unit, a message which forms a movement of the mobile terminal due to a high temperature of the mobile terminal, for inducement of an orientation change.

Various embodiments may be implemented using a machine-readable medium having instructions stored thereon for execution by a processor to perform various methods presented herein. Examples of possible machine-readable mediums include HDD (Hard Disk Drive), SSD (Solid State Disk), SDD (Silicon Disk Drive), ROM, RAM, CD-ROM, a magnetic tape, a floppy disk, an optical data storage device, the other types of storage mediums presented herein, and combinations thereof. If desired, the machine-readable medium may be realized in the form of a carrier wave (for example, a transmission over the Internet). The processor may include the controller of the mobile terminal.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A mobile terminal, comprising:
a terminal body;
a circuit board installed in the terminal body;
an electronic device mounted to at least one surface of the circuit board;
a shield can installed on the circuit board so as to cover the electronic device, and configured to shield electromagnetic waves generated from the electronic device; and
a cooling fluid filled in an inner space defined by the circuit board and the shield can, and configured to cool the electronic device,
wherein the cooling fluid is formed as at least two materials having different densities are mixed with each other.

2. The mobile terminal of claim 1, wherein the shield can includes a base portion installed on the circuit board, and configured to accommodate the electronic device therein, and
wherein a fluid introduction hole is penetratingly-formed at one side of the base portion such that the cooling fluid is filled in the inner space.

3. The mobile terminal of claim 2, wherein a shielding member fitted into the fluid introduction hole and configured to prevent leakage of the cooling fluid filled in the inner space is installed at the base portion.

4. The mobile terminal of claim 1, wherein the cooling fluid includes a material composed of water, air, FC-72 and an oil component.

5. The mobile terminal of claim 4, wherein the cooling fluid includes air, and
wherein a protrusion member disposed near the electronic device and extended from the circuit board by a thickness of the electronic device is installed at the circuit board, and the protrusion member restricts a contact between the air and the electronic device.

6. The mobile terminal of claim 2, wherein concavo-convexed portions configured to increase a contact area such that heat formed in the shield can is radiated, are formed on an upper surface or a lower surface of the base portion.

7. The mobile terminal of claim 2, wherein protruding portions configured to increase a contact area such that heat formed in the shield can is radiated, are formed on an upper surface or a lower surface of the base portion.

8. The mobile terminal of claim 2, wherein dimples configured to increase a contact area such that heat formed in the shield can is radiated, are formed on an upper surface or a lower surface of the base portion.

9. The mobile terminal of claim 1, wherein the shield can includes plural shield cans,
wherein the plural shield cans are respectively installed to cover plural electronic devices installed on an upper surface and a lower surface of the circuit board, and
wherein the cooling fluid is accommodated in the inner space defined by the circuit board and the shield can.

10. The mobile terminal of claim 9, wherein a through hole for movement of the cooling fluid is formed at the circuit board, and
wherein the inner spaces formed by the plural shield cans are communicated with each other by the through hole.

11. The mobile terminal of claim 1, wherein a waterproofing coating layer is formed on a surface of the circuit board, in order to restrict the cooling fluid accommodated in the shield can from being absorbed to the circuit board.

12. The mobile terminal of claim 1, further comprising:
a temperature sensor installed at the circuit board, and configured to sense a temperature;
a haptic module installed on the circuit board, and configured to generate a preset vibration pattern; and
a controller configured to compare the temperature sensed by the temperature sensor with a preset temperature, and to drive the haptic module when the sensed temperature is more than the preset temperature.

13. The mobile terminal of claim 12, further comprising a display unit configured to output video information by being connected to the circuit board, and
wherein when the sensed temperature is more than the preset temperature, the controller converts a direction of the video information.

14. The mobile terminal of claim 13, wherein when the sensed temperature is more than the preset temperature, the controller outputs, to the display unit, a warning message indicating a sensing of an abnormal temperature.

* * * * *